United States Patent [19]
Iwamura et al.

[11] Patent Number: 4,813,020
[45] Date of Patent: Mar. 14, 1989

[54] SEMICONDUCTOR DEVICE

[75] Inventors: Masahiro Iwamura; Ikuro Masuda, both of Hitachi, Japan

[73] Assignee: Hitachi, Ltd., Tokyo, Japan

[21] Appl. No.: 170,623

[22] Filed: Mar. 17, 1988

Related U.S. Application Data

[63] Continuation of Ser. No. 825,939, Feb. 4, 1986, abandoned.

[30] Foreign Application Priority Data

Feb. 7, 1985 [JP] Japan .................. 60-22394

[51] Int. Cl.$^4$ .............................................. G11C 7/00
[52] U.S. Cl. .................................... 365/189; 365/177; 307/446; 307/570
[58] Field of Search .............. 365/177, 174, 189, 230; 307/279, 270, 475, 476, 570, 446

[56] References Cited

U.S. PATENT DOCUMENTS 4,612,466 9/1986 Stewart .................. 307/270 X

FOREIGN PATENT DOCUMENTS 52-26181 2/1977 Japan .
54-148469 11/1979 Japan .
59-86923 5/1984 Japan .
59-205828 11/1984 Japan .

OTHER PUBLICATIONS

H. C. Lin et al., "Complementary MOS-Bipolar Transistor Structure", IEEE Transactions on Electron Devices, vol. ED-16, No. 11, Nov. 1969, pp. 945-951.

Primary Examiner—Joseph A. Popek
Attorney, Agent, or Firm—Antonelli, Terry & Wands

[57] ABSTRACT

A composite circuit including a MOS transistor and a bipolar transistor to be driven by the MOS transistors and forming an output stage, a logical inverter circuit connected to an output terminal of the composite circuit to invert the level of the output signal, and a MOS transistor having a source and a drain thereof parallelly connected across a collector and an emitter of the bipolar transistor are provided. When the bipolar transistor conducts with a voltage drop associated with a base-emitter voltage, the parallelly connected MOS transistor renders the bipolar transistor completely conductive so that a level-shiftless output signal is produced.

20 Claims, 15 Drawing Sheets

FIG. 17
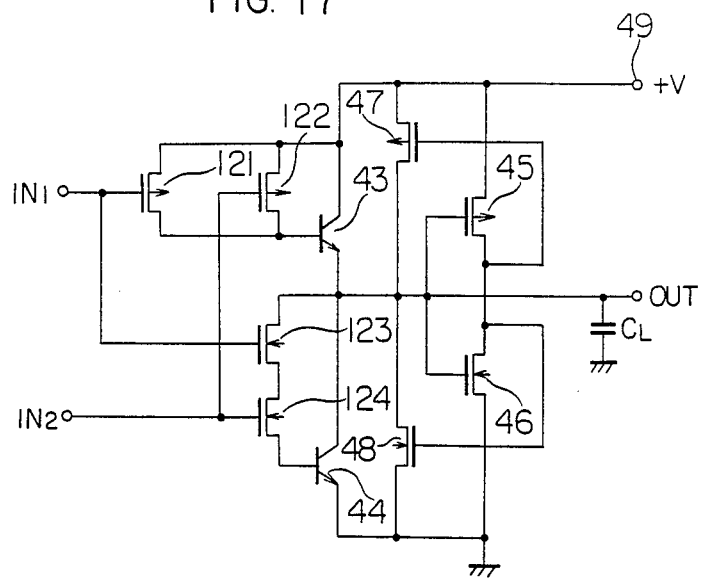
FIG. 18
FIG. 19
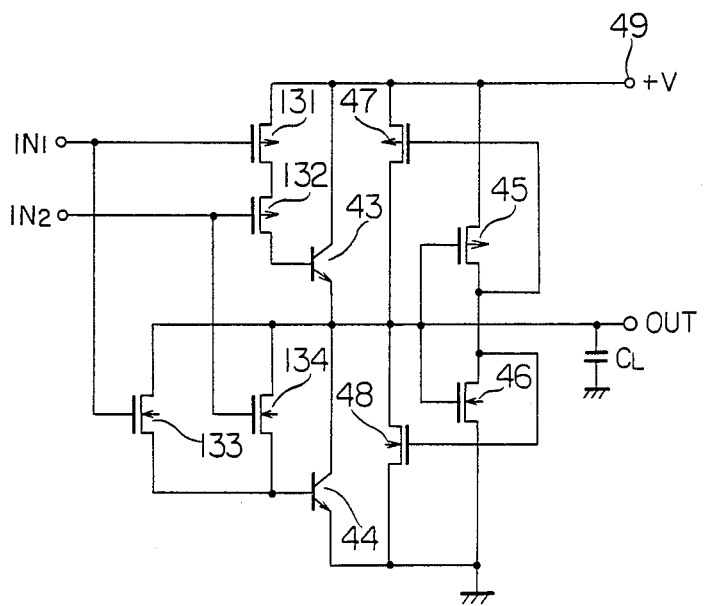
FIG. 20

SEMICONDUCTOR DEVICE

This application is a continuation of application Ser. No. 825,939, filed on Feb. 4, 1986, now abandoned.

BACKGROUND OF THE INVENTION

The present invention relates to a semiconductor device, and more particularly to a composite circuit which is a combination of a MOS (metal-oxide-semiconductor) transistor and a bipolar transistor, or a MOS-drive bipolar-output logic circuit.

Various composite circuits which utilize a low power consumption of CMOS transistors and a high load drive capability of bipolar transistors have been known.

One of those, which is shown in FIG. 1, is a circuit similar to one shown in FIG. 8 of the IEEE Transaction on Electron Devices, Vol. ED-16, No. 11, Nov. 1969, page 950. In FIG. 1, numeral 1 denotes a PMOS transistor having a source thereof connected to a power supply +V, a gate thereof connected to an input terminal IN and a drain thereof connected to a base of an NPN transistor 3, and numeral 2 denotes an NMOS transistor having a drain thereof connected to an output terminal OUT, a gate thereof connected to the input terminal IN and a source thereof connected to a base of an NPN transistor 4. A collector of the NPN transistor 3 is connected to the power supply +V and an emitter thereof is connected to the output terminal OUT. A collector of the NPN transistor 4 is connected to the output terminal OUT and an emitter thereof is connected to a common potential point or a ground potential point GND.

The operation of the circuit is as follows. When the input terminal IN is at an "L" level, the NMOS transistor 2 is off and the NPN transistor 4 is also off. On the other hand, the PMOS transistor 1 is on and a base current is supplied to the NPN transistor 3 through the PMOS transistor 1. As a result, a charge current flows from the NPN transistor 3 to a load (not shown) and the output terminal OUT is switched to an "H" level. When the input terminal IN is at the "H" level, the PMOS transistor 1 is off and the NPN transistor 3 is also off. On the other hand, the NMOS transistor 2 is on and a base current is supplied to the NPN transistor 4 through the NMOS transistor 2 and the NPN transistor 4 is turned on. As a result, the charge stored in the load is discharged through the NPN transistor 4 and the output terminal OUT is switched to the "L" level. In this circuit, an output voltage level of the circuit is shifted by base-emitter voltages $V_{BEQ1}$ and $V_{BEQ2}$ of the NPN transistors 3 and 4. Thus, the "H" level is $(+V-V_{VSEQ1})$ and the "L" level is $V_{BEQ2}$.

FIG. 2 shows a circuit similar to one disclosed in Japanese Patent Unexamined Publication No. 54-148469. In FIG. 2, numeral 5 denotes PMOS transistor having a source thereof connected to a power supply +V, a gate thereof connected to an input terminal IN and a drain thereof connected to a junction point or node B of a base of an NPN transistor 7 and a base of a PNP transistor 8. Numeral 6 denotes an NMOS transistor having a drain thereof connected to said junction point, a gate thereof connected to the input terminal IN and a source thereof connected to a power supply −V. A collector of the NPN transistor 7 is connected to the power supply +V and an emitter thereof is connected to an output terminal OUT. An emitter of the PNP transistor 8 is connected to the output terminal OUT and a collector thereof is connected to the power supply −V.

In this circuit, an output voltage level is also shifted by base-emitter voltages $V_{BEQ1}$ and $V_{BEQ2}$ of the NPN transistor 7 and the PNP transistor 8. Thus, the "H" level is $(+V-V_{BEQ1})$ and the "L" level is $(-V+V_{BEQ2})$.

FIG. 3 shows a circuit similar to one disclosed in Japanese Unexamined Patent Application No. 52-26181. In FIG. 3, numeral 9 denotes a PMOS transistor having a source thereof connected to a power supply +V, a gate thereof connected to an input terminal IN and a drain thereof connected to a base of an NPN transistor 11. Numeral 10 denotes an NMOS transistor having a drain thereof connected to an output terminal OUT, a gate thereof connected to an input terminal IN and a source thereof connected to a power supply −V. A collector of the NPN transistor 11 is connected to the power supply +V and an emitter thereof is connected to the output terminal OUT.

In this circuit, an output voltage level is also shifted by base-emitter voltage $V_{BEQ1}$ of the NPN transistor 11. Thus, the "H" level is $(+V-V_{BEQ1})$ and the "L" level is −V.

In FIG. 4, numeral 12 denotes a symbol of a MOS-drive bipolar-output logic circuit having offsets at the output levels shown in FIGS. 1 to 3.

FIG. 5 shows a MOS-drive bipolar-output tri-state circuit 13 which is similar to the circuit of FIG. 20 disclosed in U.S. patent application Ser. No. 703,171 entitled "Arithmetic Operation Unit and Arithmetic Operation Circuit" filed Feb. 19, 1985 in the name of Hitachi, Ltd., based on Japanese Patent Applications Nos. 59-31257 filed on Feb. 20, 1984 and 60-2020 filed on Jan. 11, 1985. In the figure, numerals 14 and 15 denote series-connected PMOS transistors, a source of the PMOS 14 is connected to a power supply +V and a gate thereof is connected to an input terminal $\overline{E}$. A gate of the PMOS transistor 15 is connected to an input terminal IN and a drain thereof is connected to a base of a NPN transistor 18. Numerals 16 and 17 denote series-connected NMOS transistors. A drain of the NMOS transistor 16 is connected to an output terminal OUT and a gate thereof is connected to the input terminal IN. A gate of the NMOS transistor 17 is connected to an input terminal E and a source thereof is connected to a base of an NPN transistor 19. A collector of the NPN transistor 18 is connected to the power supply +V and an emitter thereof is connected to the output terminal OUT. A collector of the NPN transistor 19 is connected to the output terminal OUT and an emitter thereof is connected to a ground GND, a load capacitor $C_L$ is connected to the output terminal OUT.

This circuit is a tri-state logic circuit and the output level is shifted. The operation is as follows.

When the input terminal E is at the "L" level and the input terminal $\overline{E}$ is at the "H" level, the PMOS transistor 14 and the NMOS transistor 17 are off, and the NPN transistor 18 and the NPN transistor 19 are also off. As a result, the output terminal OUT is in a high impedance state regardless of the level of the input terminal IN.

When the input terminal E is at the "H" level and the input level $\overline{E}$ is at the "L" level, the NMOS transistor 17 and the PMOS transistor 14 are on. If the input terminal IN is at the "L" level, the PMOS transistor 15 and the NPN transistor 18 are on and the output terminal OUT is charged to $(+V-V_{BEQ1})$. If the input terminal IN is at the "H" level, the NMOS transistor 16 and the NPN transistor 19 are on and the output terminal OUT is discharged to $+V_{BEQ2}$. Thus, this circuit functions as an inverter having an output "H" level thereof shifted down by $V_{BEQ1}$ and an output "L" level thereof shifted up by $V_{BEQ2}$.

In FIG. 6, numeral 20 denotes a symbol of the circuit of FIG. 5.

The MOS-bipolar composite circuits described above are different from a CMOS transistor buffer circuit in that they can switch a large capacitive load at a high speed and the output voltage level is shifted by the base-emitter voltage $V_{BE}$ of the bipolar transistor.

However, when such an output voltage level shifted signal is used as a gate drive signal of a MOS switch, the MOS switch may not be completely turned off in a certain circuit. A typical MOS switch circuit in which such a problem may arise is a well-known clocked inverter shown in FIG. 7. A numeral 21 in FIG. 8 denotes a symbol of FIG. 7.

In FIG. 7, numeral 22 denotes a PMOS transistor having a source thereof connected to a power supply +V, a gate thereof connected to an input terminal IN and a drain thereof connected to a source of a PMOS transistor 23. A gate of the PMOS transistor 23 is connected to a clock terminal $\bar{\phi}$ and a drain thereof is connected to an output terminal OUT. Numeral 24 denotes an NMOS transistor having a drain thereof connected to the output terminal OUT, a gate thereof connected to a clock terminal $\phi$ and a source thereof connected to a drain of an NMOS transistor 25. A gate of the NMOS transistor 25 is connected to the input terminal IN and a source thereof is connected to a common potential point GND, $C_s$ denotes a stray capacitance at the output terminal OUT.

The operation of this circuit is as follows. When $\phi$ is at the "H" level and $\bar{\phi}$ is at the "L" level, the PMOS transistor 23 and the NMOS transistor 24 are on. If the input terminal IN is at the "L" level, the NMOS transistor 25 is off and the PMOS transistor 22 is on, and the stray capacitance CS is charged through the PMOS transistors 22 and 23 so that the output terminal OUT assumes the "H" level. On the other hand, if the input terminal IN is at the "H" level, the PMOS transistor 22 is off and the NMOS transistor 25 is on, and the charge stored in the stray capacitor $C_s$ is discharged through the NMOS transistors 24 and 25 so that the output terminal OUT assumes the "L" level.

When $\phi$ is at the "L" level and $\bar{\phi}$ is at the "H" level, the PMOS transistor 23 and the NMOS transistor 24 are off. Thus, the level of the output terminal is held irrespective of the level of the input terminal IN. Thus, this circuit has a dynamic latch function.

However, when the clocks $\phi$ and $\bar{\phi}$ are supplied from the prior art composite circuit shown in FIGS. 1 to 3 or the composite circuit shown in FIG. 5 which is not prior art, the operation in the hold state is as follows. Let us assume that the power supply +V is 5 volts, the "H" levels of $\phi$ and $\bar{\phi}$ are 4.3 volts, the "L" levels thereof are 0.7 volt, the "H" level of the input terminal IN is 5 volts and the "L" level thereof is 0 volt.

When $\phi=0.7$ volt, $\bar{\phi}=4.3$ volt and the output terminal OUT is held at the "H" level, the PMOS transistor 23 and the NMOS transistor 24 conduct slightly because the gate-source voltages thereof are not completely zero. If the input terminal IN is at the "L" level, the NMOS transistor 25 is off and the PMOS transistor 22 is on. Therefore, the output terminal OUT is held at the "H" level. If the input terminal IN is at the "H" level, the NMOS transistor 25 is on and the charge stored in the stray capacitor $C_S$ is discharged through the slightly conducting NMOS transistor 24 and the on NMOS transistor 25. As a result, the output terminal OUT is switched from the "H" level to the "L" level. Similarly, when the output terminal OUT is held at the "L" level and the input terminal IN is at the "L" level, the NMOS transistor 25 is off and the PMOS transistor 22 is on. As a result, the charge stored in the stray capacitor $C_S$ is charged through the PMOS transistor 22 which is now in on state and the slightly conducting PMOS transistor 23 so that the output terminal OUT is switched from the "L" level to the "H" level.

Thus, in the prior art composite circuits, the output terminal OUT is not completely "L" level, that is, the level of the output terminal OUT does not completely reach the common potential or the lower potential of the power supply when the output terminal OUT is at the "L" level, and the output terminal OUT is not completely "H" level, that is, the level of the output terminal does not reach the higher potential of the power supply when the output terminal OUT is at the "H" level. This adversely affects to the succeeding stage circuit.

In a circuit shown in Japan Patent Unexamined Publication No. 59-205828 (FIG. 4 in particular), a logic circuit which is a composite circuit comprising MOS transistors and bipolar transistor and another logic circuit comprising MOS transistors and having the same function as the first logic circuit are connected in parallel so that the output signal level completely reach the "L" or "H" level. In this circuit, since an input capacitance is larger than that of a logic circuit which comprises only the composite circuit, an operation speed of a preceding circuit to drive the logic circuit is lower and hence an overall speed is reduced. Furthermore, in a multi-input buffer circuit, the number of elements required for the parallel MOS logic circuit increases in proportion to the number of inputs.

Reference may be made to U.S. patent application No. 680,495 filed Dec. 11, 1984 in the name of Hitachi, Ltd., and to Japanese Patent Unexamined Publication No. 59-205828.

SUMMARY OF THE INVENTION

It is an object of the present invention to provide a logic circuit or semiconductor device which is constructed by a composite circuit comprising MOS transistors and bipolar transistors and which is free from a level shift of an output signal, that is, in which the output signal is at a completely low level, or common potential or one of power supply voltages when the output signal is at an "L" level, and the output signal is at a completely high level, or the other power supply voltage when the output voltage is at an "H" level, and which can switch a large capacitive load at a high speed.

In accordance with one aspect of the present invention, there are provided logical inverting means connected to an output terminal of a composite circuit comprising MOS transistors and bipolar transistors driven by the MOS transistors for inverting a level of an output signal, and MOS transistors each having a source and a drain thereof connected in parallel between a collector and an emitter of a corresponding one of the bipolar transistors in the output stage of the composite circuit and adapted to be turned on and off by the output signal of the logical inverting means. When the bipolar transistors conduct with voltage drops corresponding to base-emitter voltages, they are completely conducted by the MOS transistors.

In the present invention, the term complete "L" level means the common potential or one of the power supply voltages, and the term complete "H" level means the other power supply voltage.

BRIEF DESCRIPTION OF THE DRAWINGS

FIG. 17 shows a seventh embodiment of the present invention.

FIG. 18 shows a symbol for the circuit of FIG. 17.

FIG. 19 shows an eighth embodiment of the present invention.

FIG. 20 shows a symbol for the circuit of FIG. 19.

DESCRIPTION OF THE PREFERRED EMBODIMENTS

In the present specification and claims, terms "input terminal", "output terminal" and "terminal" are defined as electrical connecting terminals including junction points of patterns on an integrated circuit device.

Figure 9:
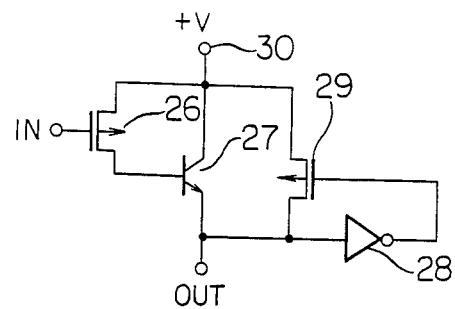
FIGS. 9 to 12 show first to fourth embodiments of the present invention.

FIG. 9 shows a first embodiment of the present invention. Numeral 26 denotes an enhancement type PMOS transistor having a source thereof connected to a power supply $+V$ through a terminal 30, a gate thereof connected to an input terminal IN and a drain thereof connected to a base of an NPN switching transistor 27. A collector of the NPN transistor 27 is connected to the power supply $+V$ through the terminal 30 and an emitter thereof is connected to an output terminal OUT. Numeral 28 denotes an inverter having an input terminal thereof connected to the output terminal OUT and an output terminal thereof connected to a gate of an enhancement type switching PMOS transistor 29. A source of the PMOS transistor 29 is connected to the power supply $+V$ and a drain thereof is connected to the output terminal OUT.

The operation of this circuit is as follows. When the input terminal IN is at the "L" level, the PMOS transistor 26 is on and the NPN transistor 27 is also on. As a result, a capacitive load (not shown) connected to the output terminal OUT is charged through the NPN transistor 27 and the level of the output terminal OUT rises to $(+V-V_{BE})$. On the other hand, as the level of the output terminal OUT exceeds a logical threshold (VLT) of the inverter 28, the output thereof is switched to the "L" level and the PMOS transistor 29 is turned on. Since the MOS transistor has no offset at the output voltage thereof, an electrical connection substantially free from a voltage drop is established between the drain and the source in the conduction state. Accordingly, the output level raised to $(+V-V_{BE})$ is charged up to $+V$ through the PMOS transistor 29. When the input terminal IN is at the "H" level, the PMOS transistor 26 is off and the NPN transistor 27 is also off. Accordingly, the level at the output terminal OUT does not change.

Figure 10:
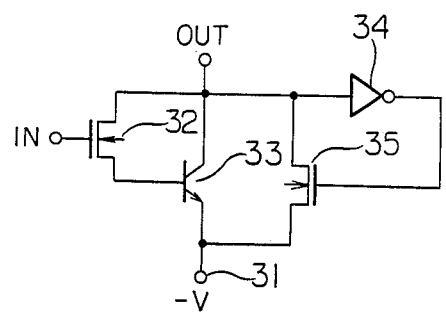

FIG. 10 shows a second embodiment of the present invention. Numeral 32 denotes an enhancement type NMOS transistor having a drain thereof connected to an output terminal OUT, a gate thereof connected to an input terminal IN and a source thereof connected to a base of a switching NPN transistor 33. A collector of the NPN transistor 33 is connected to the output terminal OUT and an emitter thereof is connected to a power supply $-V$ through a terminal 31. Numeral 34 denotes an inverter having an input terminal thereof connected to the output terminal OUT and an output terminal thereof connected to a gate of a switching NMOS transistor 35. A drain of the NMOS transistor 35 is connected to the output terminal OUT and a source thereof is connected to the power supply $-V$.

The operation of this circuit is as follows. When the input terminal IN is at the "H" level, the NMOS transistor 32 is on and the NPN transistor 33 is also on. As a result, a charge stored in a capacitive load is discharged through the NPN transistor 33 and the level of the output terminal OUT drops to $(-V+V_{BE})$. On the other hand, as the level of the output terminal OUT drops below the VLT of the inverter 34, the output level thereof is switched to the "H" level and the NMOS transistor 35 is turned on without essential voltage drop thereacross. As a result, the output level dropped to $(-V+V_{BE})$ is discharged to $-V$ through the NMOS transistor 35. When the input terminal IN is at the "L" level, the NMOS transistor 32 is off and the NPN transistor 33 is also off. Accordingly, the level of the output terminal OUT does not change.

Figure 11:
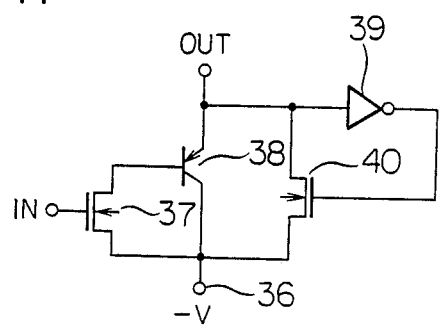

FIG. 11 shows a third embodiment of the present invention. Numeral 37 denotes an enhancement type NMOS transistor having a drain thereof connected to a base of a switching PNP transistor 38, a gate thereof connected to an input terminal IN and a source thereof connected to a power supply $-V$ through a terminal 36. An emitter of the PNP transistor 38 is connected to an output terminal OUT and a collector thereof is connected to the power supply $-V$ through the terminal 36. Numeral 39 denotes an inverter having an input terminal thereof connected to the output terminal OUT and an output terminal thereof connected to a gate of a switching NMOS transistor 40. A drain of the NMOS transistor 40 is connected to the output terminal OUT and a source thereof is connected to the power supply $-V$.

The operation of this circuit is as follows. When the input terminal IN is at the "H" level, the NMOS transistor 37 is on and the PNP transistor 38 is also on. As a result, a charge stored in a capacitive load is discharged through the PNP transistor 38 and the level of the output terminal OUT drops to $(-V+V_{BE})$ On the other hand, as the level of the output terminal OUT drops below the VLT of the inverter 39, the output thereof is switched to the "H" level and the NMOS transistor 40 is turned on so that an electrical connection essentially free from a voltage drop is established between the drain and the source. Accordingly, the output level dropped to $(-V+V_{BE})$ is discharged to $-V$ through the NMOS transistor 40. When the input terminal IN is at the "L" level, the NMOS transistor 37 is off and the PNP transistor 38 is also off. Accordingly, the level of the output terminal OUT does not change.

Figure 12:
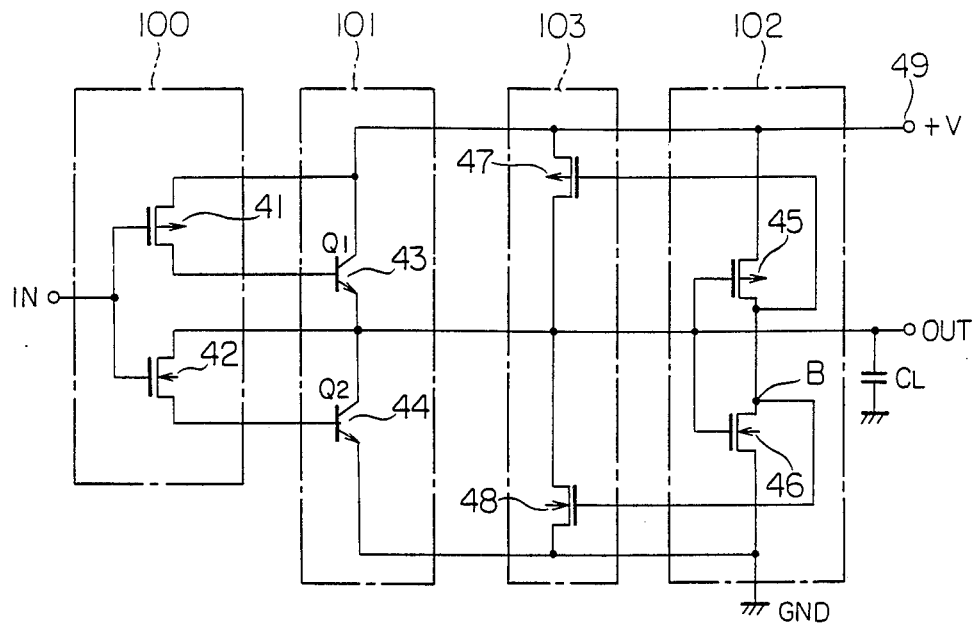

FIG. 12 shows a fourth embodiment of the present invention. Numeral 41 denotes an enhancement type PMOS transistor having a source thereof connected to a power supply $+V$ through a terminal 49, a gate thereof connected to an input terminal IN and a drain thereof connected to a base of an NPN transistor 43. Numeral 42 denotes an enhancement type NMOS transistor having a drain thereof connected to an output terminal OUT, a gate thereof connected to the input terminal IN and a source thereof connected to a base of an NPN transistor 44. The PMOS transistor 41 and the NMOS transistor 42 form a logical control circuit 100. A collector of the NPN transistor 43 is connected to the power supply $+V$ through the terminal 49 and an emitter thereof is connected to the output terminal OUT. A collector of the NPN transistor 44 is connected to the output terminal OUT and an emitter thereof is connected to a common potential point GND. The transistors 43 and 44 form a switching circuit 101. Numeral 45 denotes an enhancement type PMOS transistor having a source thereof connected to the power supply $+V$, a gate thereof connected to the output terminal OUT and a drain thereof connected to a drain of an enhancement type NMOS transistor 46. A gate of the NMOS transistor 46 is connected to the output terminal OUT and a source thereof is connected to GND. The MOS transistors 45 and 46 form an inverter 102. Numeral 47 denotes an enhancement type PMOS transistor having a source thereof connected to the power supply $+V$, a gate thereof connected to the common drain B of the PMOS transistor 45 and the NMOS transistor 46 and a drain thereof connected to the output terminal OUT. Numeral 48 denotes an enhancement type NMOS transistor having a drain thereof connected to the output terminal OUT, a gate thereof connected to the common drain B of the PMOS transistor 45 and the NMOS transistor 46 and a source thereof connected to GND. The MOS transistors 47 and 48 form a switching circuit 103.

The operation of this circuit is as follows. When the input terminal IN is at the "L" level, the NMOS transistor 42 is off and the NPN transistor 44 is also off. On the other hand, the PMOS transistor 41 is on and supplies a base current to the NPN transistor 43 to turn it on. As a result, a charging current flows into a capacitive load $C_L$ through the NPN transistor 43 so that the level of the output terminal OUT rises. The charging current through the NPN transistor 43 flows until the level of the output terminal OUT reaches $(+V-V_{BEQ1})$, when the NPN transistor 43 is cut off. On the other hand, as the output level sufficiently rises, the PMOS transistor 45 is turned off and the NMOS transistor 46 is turned on. As a result, the level at the node B is switched to the "L" level. Thus, the PMOS transistor 47 is turned on and an electrical connection essentially free from a voltage drop is established between the source and the drain, and the NMOS transistor 48 is turned off. Accordingly, a charging current flows into the load $C_L$ through the PMOS transistor 47 so that the output terminal OUT is charged up to the same level as the power supply $+V$.

When the input terminal IN is at the "H" level, the PMOS transistor 41 is off and the NPN transistor 43 is also off. On the other hand, the NMOS transistor 42 is on and a base current is supplied to the NPN transistor 44 through the NMOS transistor 42 so that the NPN transistor 44 is turned on. As a result, a charge stored in a capacitive load $C_L$ is discharged through the NPN transistor 44 and the level of the output terminal OUT drops. The discharging current through the NPN transistor 44 flows until the output level reaches $V_{BEQ2}$, when the NPN transistor 44 is cut off. On the other hand, as the level of the output terminal OUT sufficiently drops, the PMOS transistor 45 is turned on, the NMOS transistor 46 is turned off and the node B assumes the "H" level. As a result, the PMOS transistor 47 is turned off and the NMOS transistor 48 is turned on and an electrical connection essentially free from a voltage drop is established between the drain and the source. Accordingly, the charge stored in the load $C_L$ is discharged through the NMOS transistor 48 and the level of the output terminal OUT drops to the ground potential or the common potential.

Figure 4:
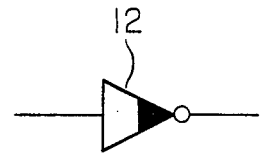
FIG. 4 shows a symbol for the circuits of FIGS. 1 to 3.
Figure 16:
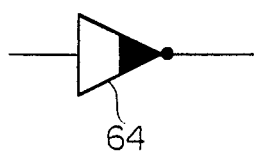
FIG. 16 shows a symbol for the circuits of FIGS. 12, 14 and 15.

Numeral 64 in FIG. 16 denotes a logical symbol for the circuit of the present embodiment which is distinguished from the logical symbol for the prior art circuit (FIG. 4).

In order to increase a switching speed when the NPN transistors 43 and 44 are turned off, pathes for discharging the base charges are necessary in the respective base circuits. The discharging path may be a passive device, an active device or a combination thereof, although it is omitted in the drawing because it does not relates to the substance of the present invention.

Figure 1:
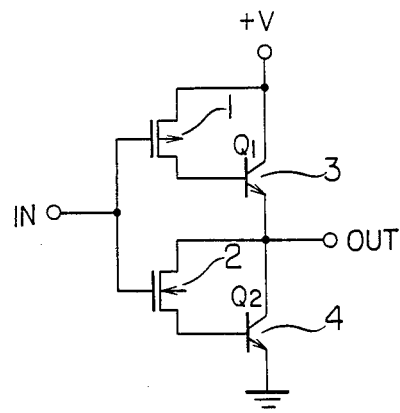
FIGS. 1 to 3 show prior art composite circuits.
Figure 2:
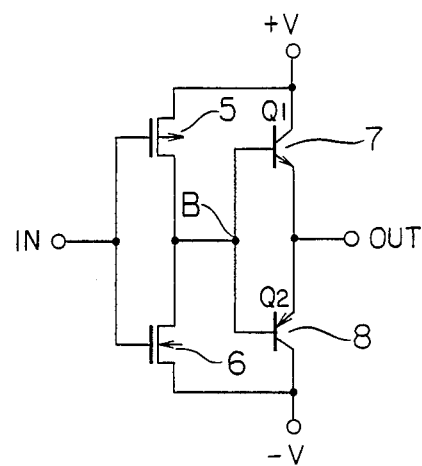
Figure 3:
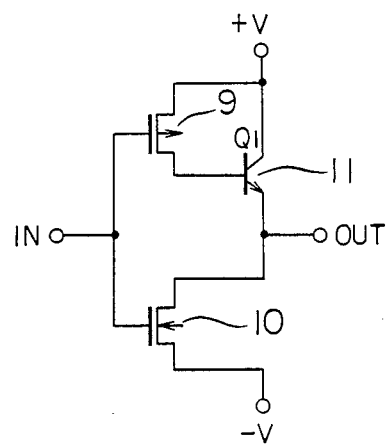
Figure 13:
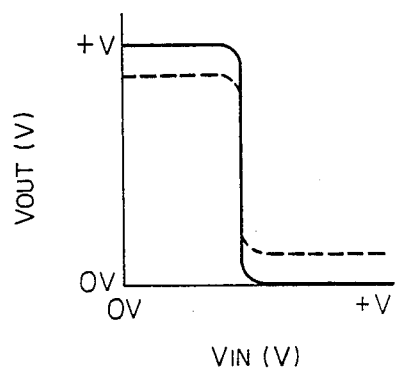
FIG. 13 shows an input-output characteristic of the circuit of FIG. 12.

FIG. 13 shows input/output characteristics of the prior art composite circuit of FIG. 1 and the composite circuit of the present invention shown in FIG. 12. A broken line shows the input/output characteristic of the prior art and a solid line shows the input/output characteristic of the circuit of the present invention. It is seen from FIG. 13 that in the composite circuit of the present invention, the high level of the output is switched to the power supply potential and the low level is switched to the GND potential.

Figure 14:
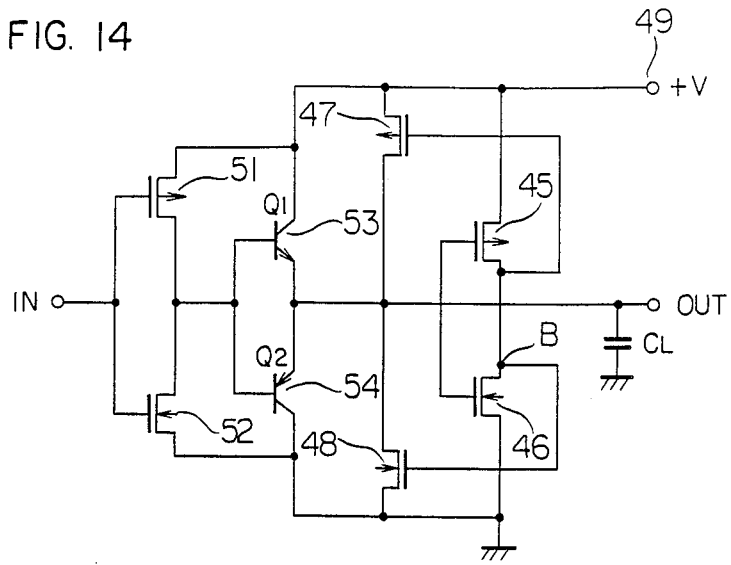
FIGS. 14 and 15 show fifth and sixth embodiments of the present invention.

FIG. 14 shows a fifth embodiment of the present invention. The like elements to those of FIG. 12 are designated by the like numerals. Numeral 51 denotes an enhancement type PMOS transistor having a source thereof connected to a power supply $+V$ through a terminal 49, a gate thereof connected to an input terminal IN and a drain thereof connected to a drain of an enhancement type NMOS transistor 52, a base of an NPN transistor 53 and a base of a PNP transistor 54. A gate of the NMOS transistor 52 is connected to the input terminal IN and a source thereof is connected to a common potential point GND. The PMOS transistor 51 and the NMOS transistor 52 form a logical control circuit. A collector of the NPN transistor 53 is connected to the power supply $+V$ and an emitter thereof is connected to an output terminal OUT. An emitter of the PNP transistor 54 is connected to the output terminal OUT and a collector thereof is connected to GND. The transistors 53 and 54 form a switching circuit.

This circuit forms an inverter as a whole and operates as follows. When the input terminal IN is at the "L" level, the output of the inverter comprising the PMOS transistor 51 and the NMOS transistor 52 assumes the "H" level, the PNP transistor 54 is turned off and the NPN transistor 53 is turned on. As a result, a capacitive load $C_L$ is charged through the NPN transistor 53 and the level of the output terminal OUT rises. When the level of the output terminal OUT rises to $(+V-V_{BEQ1})$, the NPN transistor 53 is cut off. On the other hand, as the output level sufficiently rises, the PMOS transistor 45 is turned off, the NMOS transistor 46 is turned on and the node B assumes the "L" level. As a result, the PMOS transistor 47 is turned on and an electrical connection essentially free from a voltage drop is established between the drain and the source. On the other hand, the NMOS transistor 48 is turned on. Accordingly, the capacitive load $C_L$ is charged by the PMOS transistor 47 and the output terminal OUT rises to the power supply potential $+V$.

When the input terminal IN is at the "H" level, the output of the inverter comprising the PMOS transistor 51 and the NMOS transistor 52 assumes the "L" level, the NPN transistor 53 is turned off and the PNP transistor 54 is turned on. As a result, the charge stored in the load $C_L$ is discharged through the PNP transistor 54 and the level of the output terminal OUT drops. The discharge through the PNP transistor 54 continues until the output level reaches $V_{BEQ2}$, when the PNP transistor 54 is cut off. On the other hand, as the output level sufficiently drops, the PMOS transistor 45 is turned on and the NMOS transistor 46 is turned off. As a result, the PMOS transistor 47 is turned off and the NMOS transistor 48 is turned on, and an electrical connection essentially free from a voltage drop is established between the drain and the source. Accordingly, the charge remaining in the load $C_L$ is discharged through the NMOS transistor 48 and the output level drops to GND. A logical symbol of the circuit of the present embodiment is shown in FIG. 16.

Figure 15:
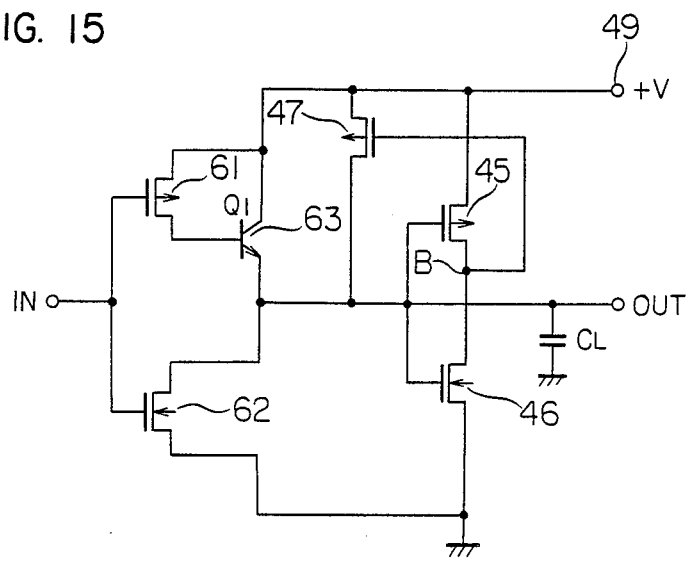

FIG. 15 shows a sixth embodiment of the present invention. The like elements to those shown in FIG. 12 are designated by the like numerals. Numeral 61 denotes an enhancement type PMOS transistor having a source thereof connected to a power supply $+V$ through a terminal 49, a gate thereof connected to an input terminal IN and a drain thereof connected to a base of an NPN transistor 63. Numeral 62 denotes an enhancement type NMOS transistor having a drain thereof connected to an output terminal OUT, a gate thereof connected to the input terminal IN and a source thereof connected to a common potential point GND. The PMOS transistor 61 and the NMOS transistor 62 form a logical control circuit. The bipolar transistor 63 forms a switch. The PMOS transistor 47 forms another switch. The NMOS transistor 62 is common to the logical control circuit and the other switch.

This circuit forms an inverter as a whole and operates as follows. When the input terminal IN is at the "L" level, the NMOS transistor 62 is off, the PMOS transistor 61 is on and the NPN transistor 63 is on. As a result, a capacitive load $C_L$ is charged through the NPN transistor 63 and the level of the output terminal OUT rises. As the output level rises to $(+V-V_{BEQ1})$, the NPN transistor 63 is cut off. On the other hand, as the output level sufficiently rises, the PMOS transistor 45 is turned off and the NMOS transistor 46 is turned on so that the node B assumes the "L" level. As a result, the PMOS transistor 47 is turned on and an electrical connection essentially free from a voltage drop is established between the drain and the source. Accordingly, the load $C_L$ is charged through the PMOS transistor 47 and the level of the output terminal OUT rises to the power supply potential $+V$.

When the input terminal IN is at the "H" level, the PMOS transistor 61 is off, the NPN transistor 63 is off and the NMOS transistor 62 is on, and an electrical connection essentially free from a voltage drop is established between the drain and the source. Accordingly, the charge stored in the load $C_L$ is discharged through the NMOS transistor 62 and the output level drops to GND. Since the PMOS transistor 45 is now on and the NMOS transistor 46 is now off, the node B is at the "H" level. Accordingly, the PMOS transistor 47 is now off.

The logical symbol of the present embodiment is shown in FIG. 16. While one-input circuit has been shown in the above embodiment, a multi-input NAND, NOR or a combination thereof may be used.

FIG. 17 shows a seventh embodiment of the present invention. The like elements to those shown in FIG. 12 are designated by the like numerals. Numerals 121 and 122 denote PMOS transistors having sources thereof connected to a power supply $+V$ through a terminal 49, gates thereof connected to input terminals $IN_1$ and $IN_2$, respectively, and drains thereof connected to a base of an NPN transistor 43. Numerals 123 and 124 denote series-connected NMOS transistors. A drain of the NMOS transistor 123 is connected to an output node OUT and a gate thereof is connected to the input terminal $IN_1$. A gate of the NMOS transistor 124 is connected to the input terminal $IN_2$ and a source thereof is connected to a base of an NPN transistor 44. The PMOS transistors 121 and 122 and the NMOS transistors 123 and 124 form a logical control circuit. A collector of the NPN transistor 43 is connected to the power supply $+V$ and an emitter thereof is connected to an output terminal OUT. A collector of the NPN transistor 44 is connected to the output terminal OUT and an emitter thereof is connected to GND.

This circuit forms a two-input NAND circuit as a whole and operates as follows. When at least one of the input terminals $IN_1$ and $IN_2$ is at the "L" level, at least one of the NMOS transistors 123 and 124 is off, and the NPN transistor 44 is also off.

On the other hand, at least one of the PMOS transistors 121 and 122 is turned on and the NPN transistor 43 is also turned on. As a result, a capacitive load $C_L$ is charged through the NPN transistor 43 and the output terminal OUT assumes the "H" level.

When both of the input terminals $IN_1$ and $IN_2$ are at the "H" level, the PMOS transistors 121 and 122 are off and the NPN transistor 43 is also off.

On the other hand, both of the NMOS transistors 123 and 124 are on and the NPN transistor 44 is also on. As a result, the charge stored in the load $C_L$ is discharged through the NPN transistor 44 and the output terminal OUT assumes the "L" level.

The output terminal OUT assumes the power supply potential $+V$ or the GND level by the function of the PMOS transistors 45 and 47 and the NMOS transistors 46 and 48, in the same manner as described in connection with FIG. 12.

FIG. 18 shows a logical symbol for the circuit of FIG. 17.

FIG. 19 shows an eighth embodiment of the present invention. The like elements to those shown in FIG. 12 are designated by the like numerals. Numerals 131 and 132 denote series-connected PMOS transistors. A source of the PMOS transistor 131 is connected to a power supply $+V$ through a terminal 49, and a gate thereof is connected to an input terminal $IN_1$. A gate of the PMOS transistor 132 is connected to an input terminal $IN_2$ and a drain thereof is connected to a base of an NPN transistor 43. Numerals 133 and 134 denote NMOS transistors having drains thereof connected to an output terminal OUT and sources thereof connected to a base of an NPN transistor 44. A gate of the NMOS transistor 133 is connected to the input terminal $IN_1$, and a gate of the NMOS transistor 134 is connected to the input terminal $IN_2$. The PMOS transistors 131 and 132 and the NMOS transistors 133 and 134 form a logical control circuit. A collector of the NPN transistor 43 is connected to the power supply $+V$ and an emitter thereof is connected to the output terminal OUT. A collector of the NPN transistor 44 is connected to the output terminal OUT and an emitter thereof is connected to GND.

This circuit forms a two-input NOR circuit as a whole and operates as follows.

When both of the inputs $IN_1$ and $IN_2$ are at the "L" level, the NMOS transistors 133 and 134 are off and the NPN transistor 44 is also off. On the other hand, the PMOS transistors 131 and 132 are on and the NPN transistor 43 is on. As a result, the capacitive load $C_L$ is charged through the NPN transistor 43 and the output terminal OUT assumes the "H" level. When at least one of the input terminals $IN_1$ and $IN_2$ is at the "H" level, at least one of the PMOS transistors 131 and 132 is off and the NPN transistor 43 is off. On the other hand, at least one of the NMOS transistors 133 and 134 is on and the NPN transistor 44 is on. As a result, a charge stored in the capacitive load $C_L$ is discharged through the NPN transistor 44 and the output level OUT assumes the "L" level. The output terminal OUT assumes the power supply potential $+V$ or the GND level by the function of the PMOS transistors 45 and 47 and the NMOS transistors 46 and 48 in the same manner as described in conjunction with FIG. 12.

FIG. 20 shows a logical symbol for the present embodiment.

Figure 5:
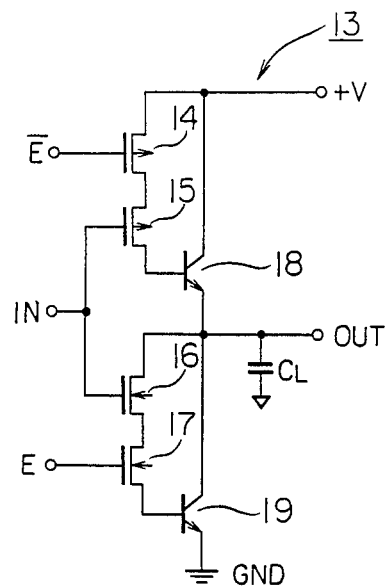
FIG. 5 shows another composite circuit.
Figure 6:
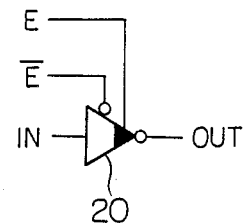
FIG. 6 shows a symbol for the circuit of FIG. 5.
Figure 21:
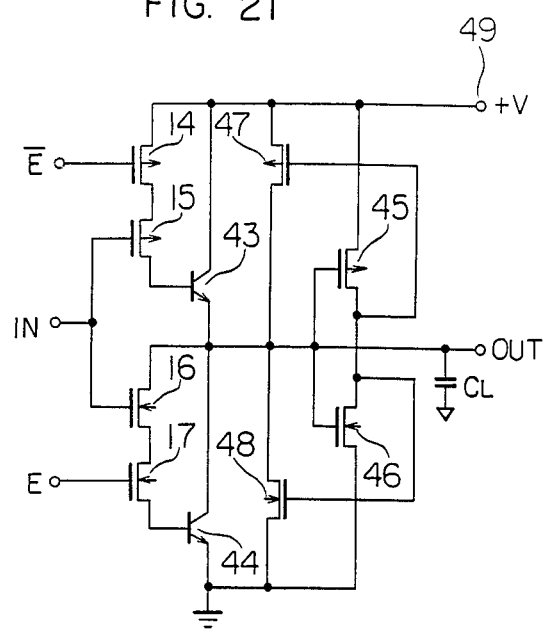
FIG. 21 shows a ninth embodiment of the present invention.

FIG. 21 shows a ninth embodiment of the present invention. The like elements to those shown in FIGS. 12 and 5 are designated by the like numerals. The bipolar NPN transistors 43 and 44, the PMOS transistors 45 and 47 and the NMOS transistors 46 and 48 are same as those of FIG. 12, and other portion of the circuit is same as FIG. 5. The PMOS transistors 14 and 15, and the NMOS transistors 16 and 17 form a logical control circuit.

A logical function of this circuit is a tri-state logic circuit like FIG. 5 but differs from the circuit of FIG. 14 in that the output terminal OUT does not include a level shift because of the function of the PMOS transistors 45 and 47 and the NMOS transistors 46 and 48.

Figure 22:
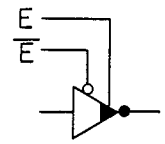
FIG. 22 shows a symbol for the circuit of FIG. 21.

FIG. 22 shows a logical symbol for the circuit of FIG. 21.

As seen from the embodiments shown in FIG. 12, 14, 17, 19 and 21, a characteristic of the MOS-drive bipolar-output level-shiftless logic circuit of the present invention resides in that a configuration of the portion of the circuit for compensating for the level shift of the output, which comprises the PMOS transistors 45 and 47 and the NMOS transistors 46 and 48 does not change even if the logic of the MOS logical control circuit which controls the bipolar transistors changes. In accordance with the present invention, the output signal can be essentially perfectly switched from the power supply potential to the ground or common potential. The switching is effected at a high speed.

Figure 23:
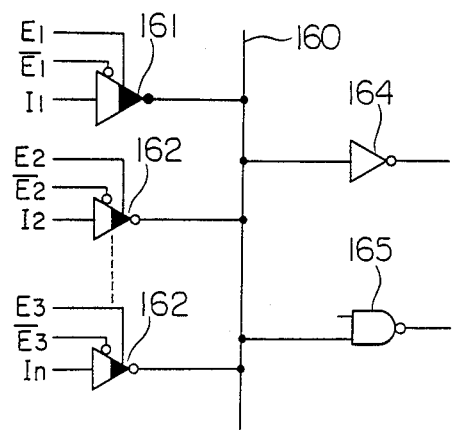
FIGS. 23 to 33 show tenth to twentyth embodiments of the present embodiment.

FIG. 23 shows a tenth embodiment of the present invention. Numeral 160 denotes a signal bus and numerals 164 and 165 denote logical gates which receive signals from the signal bus 160. Numeral 161 denotes the level-shiftless tri-state logic circuit shown in FIG. 21. It outputs an input $I_1$ to the signal bus 160 by control signals $E_1$ and $\overline{E}_1$. Numerals 162 and 163 denote tri-state logic circuits having level shifts at outputs, such as that shown in FIG. 5.

In the present embodiment, the level-shiftless tri-state logic circuit and the plurality of tri-state circuits with level shifts drive the signal bus 160 so that the level-shiftless signal is produced on the signal bus.

When the tri-state logic circuit with the level shift 162 or 163 drives the signal bus 160, the level shift compensation circuit (PMOS transistors 45 and 47, and NMOS transistors 46 and 48 in FIG. 15) of the level shiftless tri-state logic circuit 161 functions so that the level-shiftless signal is produced on the signal bus 160.

In accordance with the present embodiment, since the tri-state logic circuits 162 and 163 can be constructed with less number of elements than that of the tri-state logic circuit 161, the level-shiftless bus signal is obtained with a smaller element area. The level-shiftless bus signal is important in order to avoid the attenuation of the gate drive signal of the logic circuit which receives the bus signal, and to prevent the increase of power consumption.

Figure 24:
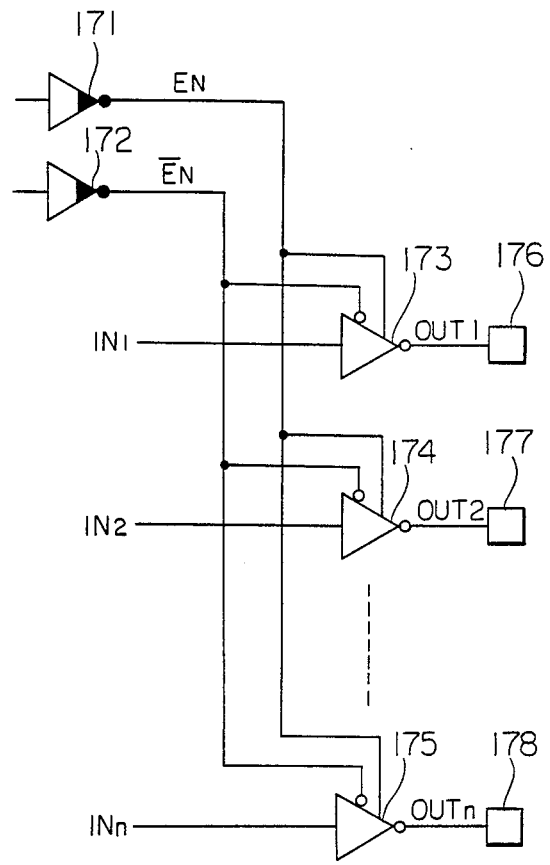

FIG. 24 shows an eleventh embodiment of the present invention. Numerals 171 and 172 denote level-shiftless MOS-drive bipolar-output logic circuits, numerals 173, 174 and 175 denote tri-state output buffer circuits, and numerals 176, 177 and 178 denote pads through which outputs are derived from the integrated circuit chip to external terminals. The tri-state output buffers 173, 174 and 175 output input signals $IN_1$, $IN_2$ and $IN_n$ depending on output signals from the logic circuits 171 and 172. One of performance indices of the tri-state output buffer is a delay time from the input of the drive signals EN and $\overline{EN}$ to the transmission of signals to $OUT_1$, $OUT_2$, --- $OUT_n$. It is important to reduce the delay times in the drive circuits 171 and 172. A typical application of the tri-state output buffer is a data bus output of a microprocessor which parallelly outputs 8 bits, 16 bits, or 32 bits. Accordintly, the drive circuits 171 and 172 have to drive a number of tri-state buffers parallelly. Because of input capacitances and long wirings of the tri-state buffers, a large load has to be driven. Accordingly, the bipolar-output logic circuits 171 and 172 are very effective in driving such a large load at a high speed.

Another performance index of the tri-state output buffer is that a leakage current from the power supply to the output terminal or from the output terminal to GND is small when the output is in a high impedance state. In order to reduce the leakage current, the path from the power supply of the tri-state output buffer circuit to the output terminal and the path from the output terminal to GND must be completely cut off. To this end, it is essential that the drive circuits 171 and 172 are the level-shiftless logic circuits.

Figure 25:
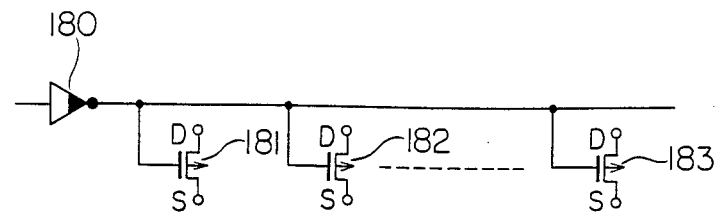

FIG. 25 shows a twelvth embodiment of the present invention. Numeral 180 denotes a MOS-drive bipolar-output level-shiftless logic circuit. An output terminal thereof is connected to gates of NMOS transistors 181, 182 and 183 to turn on and off them. Drains and sources of the NMOS transistors 181, 182 and 183 are connected to predetermined nodes to construct various circuits. In the present embodiment, the drive circuit 180 is preferably the MOS-drive bipolar-output logic circuit in order to drive a number of gates at a high speed, and it is important that at least the low level output is shiftless in order to completely cut off the NMOS transistors 181, 182 and 183.

Figure 26:
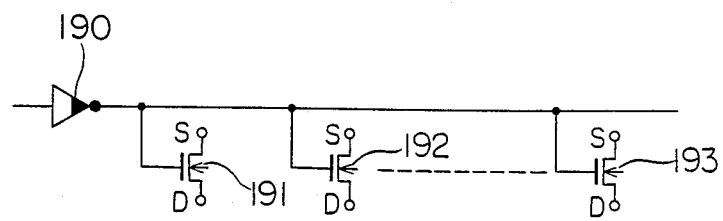

FIG. 26 shows a thirteenth embodiment of the present invention. Numeral 190 denotes a MOS-drive bipolar-output level-shiftless logic circuit. An output terminal thereof is connected to gates of the PMOS transistors 191, 192 and 193 to turn on and off them. Sources and drains of the PMOS transistors 191, 192 and 193 are connected to predetermined nodes to construct various circuits. In the present embodiment, the drive circuit 190 is preferably the MOS-drive bipolar-output logic circuit in order to drive a number of gates at a high speed, and it is important that at least the high level output is level-shiftless in order to completely cut off the PMOS transistors 191, 192 and 193.

Figure 27:
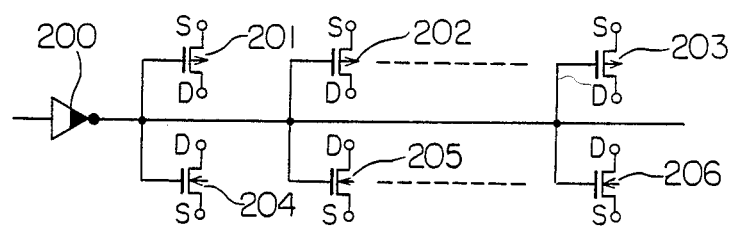

FIG. 27 shows a fourteenth embodiment of the present invention. Numeral 200 denotes a MOS-drive bipolar-output level-shiftless logic circuit. An output terminal thereof is connected to gates of PMOS transistors 201, 202 and 203 and the NMOS transistors 204, 205 and 206 to turn on and off them. Sources and drains of the PMOS transistors 201, 202 and 203 and the NMOS transistors 204, 205 and 206 are connected to predetermined nodes to construct various circuits. In the present embodiment, the drive circuit 200 is preferably the MOS-drive bipolar-output logic circuit in order to drive a number of gates at a high speed. It is important that the high level output is level-shiftless in order to completely cut off the PMOS transistors 201, 202 and 203, and the low level output is level-shiftless in order to completely cut off the NMOS transistors 204, 205 and 206.

Figure 28:
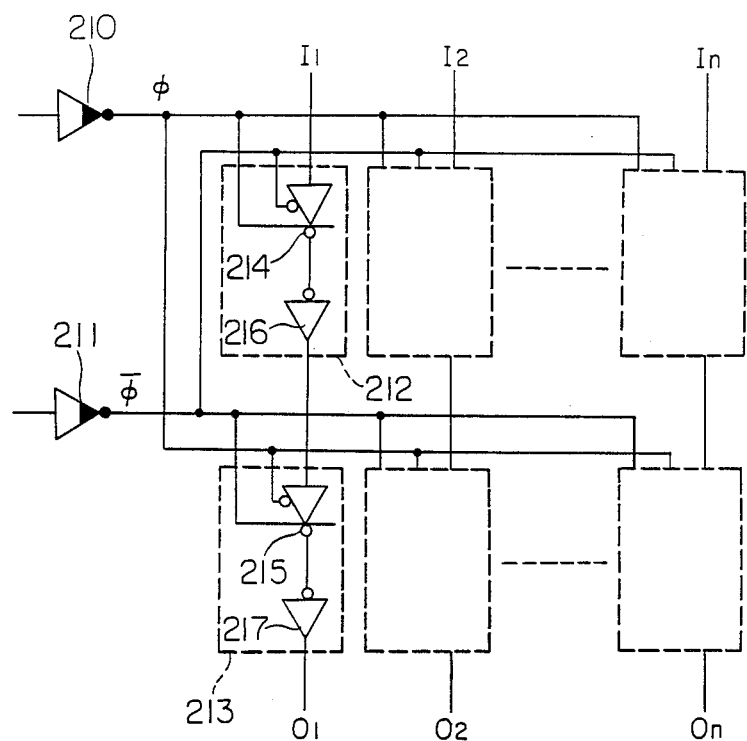

FIG. 28 shows a fifteenth embodiment of the present invention. Numerals 210 and 211 denote MOS-drive bipolar-output level-shiftless logic circuits. Outputs thereof drive a plurality of 1-bit dynamic latch circuits represented by 212 and 213. The dynamic latch 212 comprises a clocked inverter 214 and an inverter 216. The latches are arranged in n bits and two stages to construct an n-bit two-stage dynamic shift register.

Figure 7:
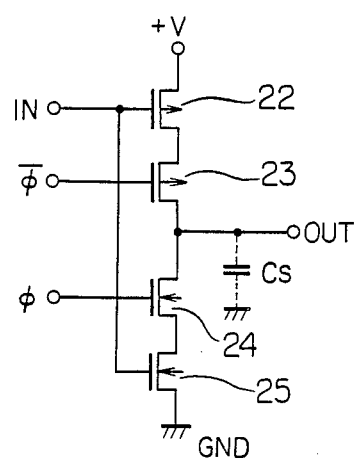
FIG. 7 shows a clocked inverter circuit.
Figure 8:
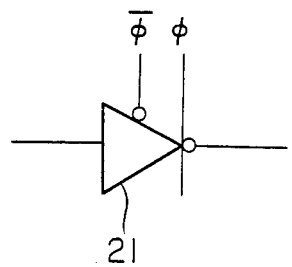
FIG. 8 shows a symbol for the circuit of FIG. 7.

In the present embodiment, the drive circuits 210 and 211 are preferably the MOS-drive bipolar-output logic circuits in order to drive a number of dynamic latches at a high speed. It is important that the high level output and the low level output are level-shiftless as was explained in connection with the dynamic latch circuit of FIG. 7.

Figure 29:
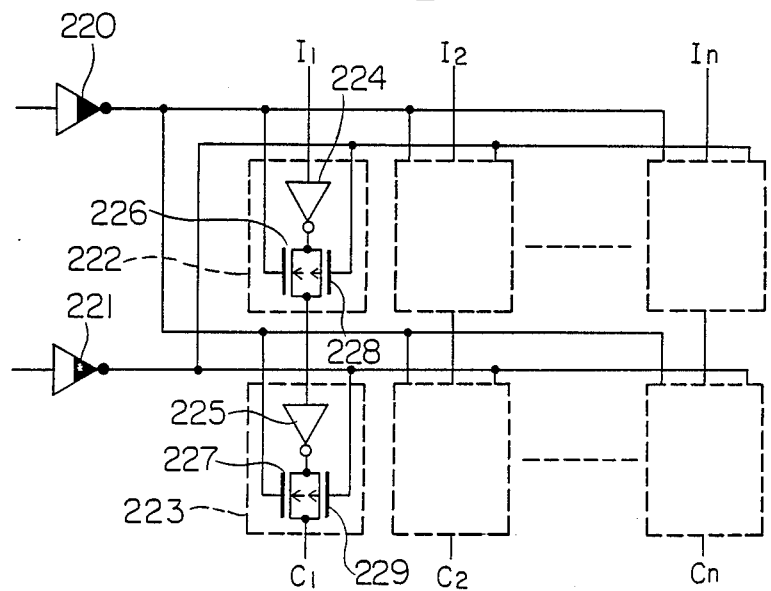

FIG. 29 shows a sixteenth embodiment of the present invention. Like the embodiment of FIG. 21, the present embodiment forms an n-bit two-stage dynamic shift register. In FIG. 22, the clocked inverters 214 and 215 of FIG. 21 are replaced by a complementary switch comprising an NMOS transistor 226 and a PMOS transistor 228, and a complementary switch comprising an NMOS transistor 227 and a PMOS transistor 229.

In the present embodiment, the drive circuits 220 and 221 are preferably the MOS-drive bipolar-output logic circuits in order to drive a number of dynamic latches at a high speed. It is important that the high level output and the low level output are level-shiftless.

Figure 30:
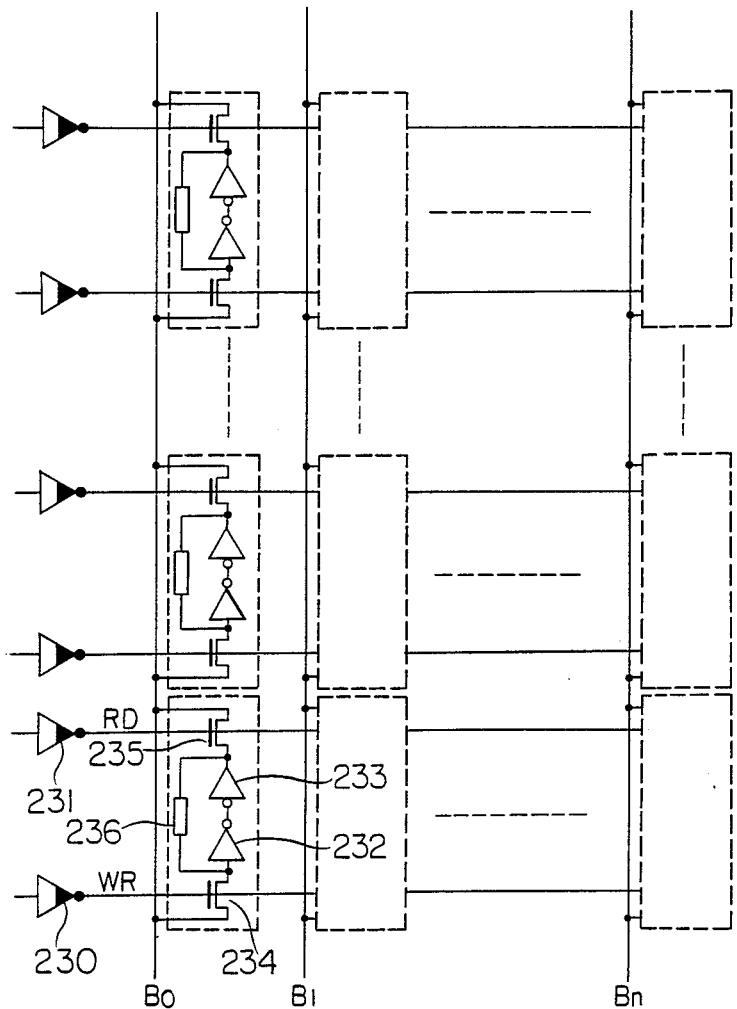

FIG. 30 shows a configuration of a register file in accordance with a seventeenth embodiment of the present invention. Numerals 230 and 231 denote MOS-drive bipolar-output level shiftless logic circuits, numerals 232 and 233 denote inverters, and numeral 236 denotes feedback means comprising an impedance element. The inverters 232 and 233 and the feedback means 236 form a one-bit memory. Numeral 234 denotes a write control enhancement type NMOS transistor. It writes a data on a data line $B_0$ into the memory when a write signal WR is "H" level, and is turned off when the write signal WR is "L" level. Numeral 235 denotes a read control enhancement type NMOS transistor. It reads the content of the memory to the data line $B_0$ when a read signal RD is "H" level, and is turned off when the read signal RD is "L" level.

In the present embodiment, the drive circuits 230 and 231 are preferably the MOS-drive bipolar-output logic circuits in order to drive a number of gates represented by 234 and 235 at a high speed. It is important that at least the low level output is level-shiftless. If the level shift is included, a number of write control and read control NMOS transistors represented by 234 and 235 which should be in the off state remains in the slightly on state. As a result, the potentials of the data lines $B_0$, $B_1$, --- $B_n$ are changed and a data line sense circuit (not shown) may malfunction.

Figure 31:
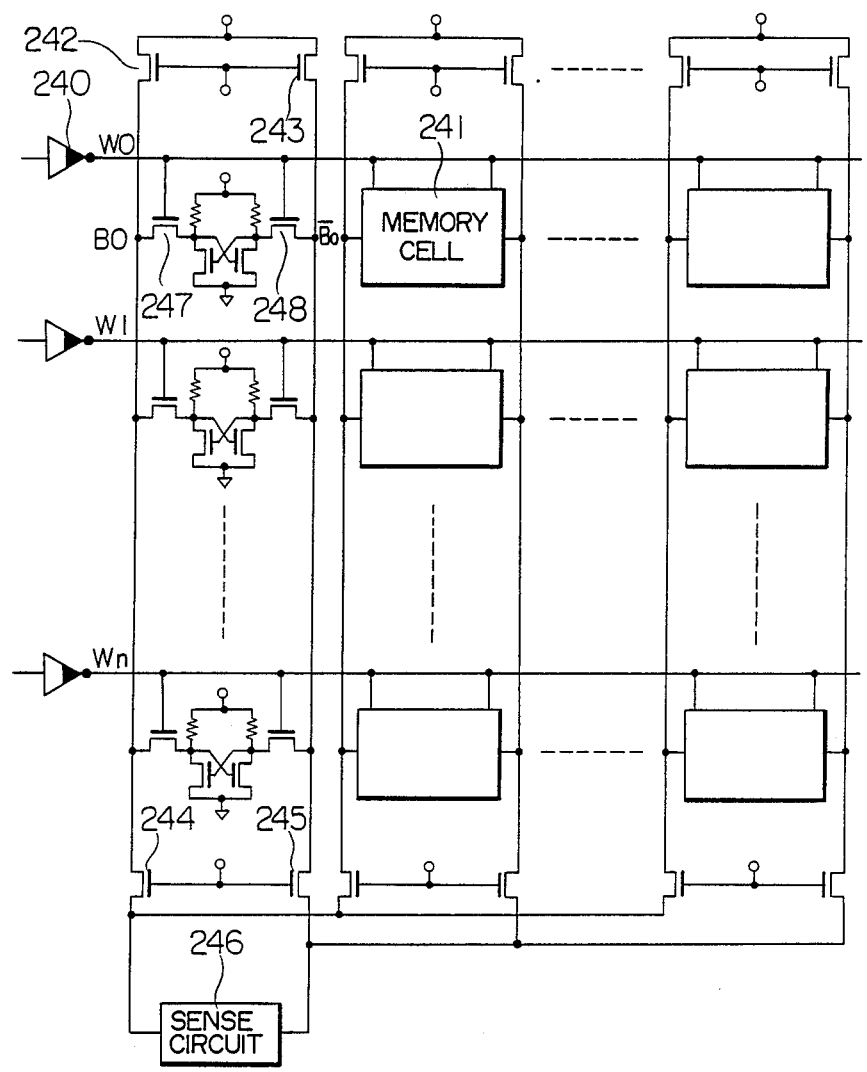

FIG. 31 shows a configuration of a static RAM in accordance with an eighteenth embodiment of the present invention. Numeral 240 denotes a MOS-drive bipolar-output level-shiftless logic circuit which drives a word line $W_0$. Numeral 241 denotes a one-bit memory cell which comprises a memory including a positive feedback inverter and write and read control enhancement type NMOS transistors 247 and 248 which are turned on and off by the word line $W_0$. Numerals 242 and 243 denote MOS transistors for precharging data lines $B_0$ and $\overline{B}_0$, numerals 244 and 245 denote column select MOS transistors and numeral 246 denotes a sense circuit.

In the present embodiment, the word line drive circuit 240 is preferably the MOS-drive bipolar-output logic circuit in order to drive a number of MOS gates represented by 247 and 248 at a high speed. It is important that at least the low level output is level-shiftless in order to completely cut off the write control and read control NMOS transistors represented by 247 and 248.

If the level shift is included, a number of NMOS transistors which should be in the off state remain in the slightly on state and the potentials of the bit lines $B_0$ and $\overline{B}_0$ are changed. As a result, the sense circuit 246 may malfunction.

Figure 32:
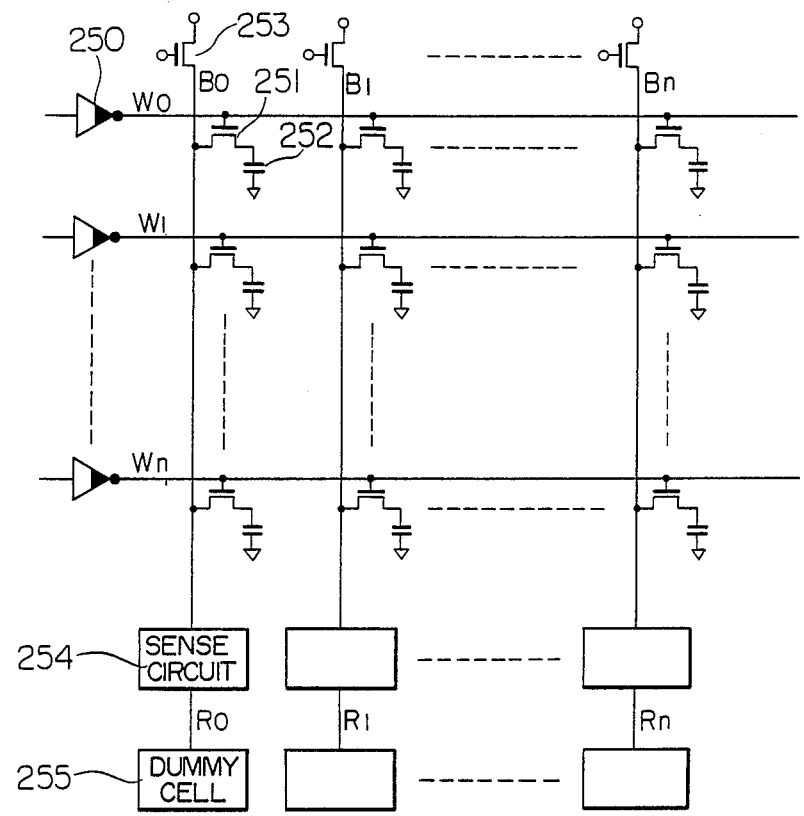

FIG. 32 shows a configuration of a dynamic RAM in accordance with a ninteenth embodiment of the present invention. Numeral 250 denotes a MOS-drive bipolar-output level-shiftless logic circuit which drives a word line $W_0$. Numeral 251 denotes an enhancement type MOS switch which is turned on and off by a signal on the word line $W_0$, and numeral 252 denotes a capacitor which stores one bit of information. The MOS switch 251 and the capacitor 252 form a one-bit dynamic memory. Numeral 254 denotes a sense circuit which differentially senses an output $R_0$ of a dummy cell 255 and a signal on a bit line $B_0$.

In the present embodiment, the word line drive circuit 250 is preferably the MOS-drive bipolar-output logic circuit in order to drive a number of NMOS gates represented by 251 at a high speed. It is important that at least the low level output is level-shiftless in order to completely cut off the NMOS transistors.

If the level shift is included, a number of NMOS transistors which should be in the off state remains in the slightly on state so that the potentials on the bit lines $B_0$, $B_1$, --- $B_n$ are changed and the sense circuit 254 may malfunction.

Figure 33:
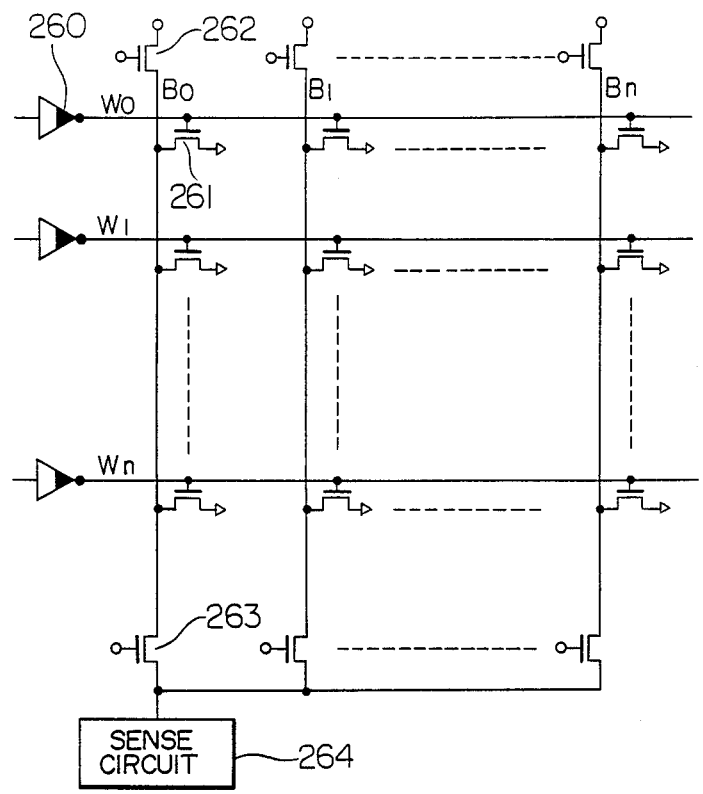

FIG. 33 shows a configuration of a ROM in accordance with a twentyth embodiment of the present invention. Numeral 260 denotes a MOS-drive bipolar-output level-shiftless logic circuit which drives a word line $W_0$. Numeral 261 denotes an enhancement type NMOS which is turned on and off by a word line $W_0$. When an "H" level signal is applied to a gate of the NMOS transistor 261, it is actively coupled to a bit line $B_0$ to store information "1". Numeral 262 denotes a MOS transistor for precharging the bit line, numeral 263 denotes a column select MOS transistor and numeral 264 denotes a sense circuit.

In the present embodiment the word line drive circuit 260 is preferably the MOS-drive bipolar-output logic circuit in order to drive a number of NMOS gates represented by 261 at a high speed. It is important that at least the low level output is level-shiftless in order to completely cut off the NMOS transistors.

If the level shift is included, a number of NMOS transistors which should be in the off state remain in the slightly on state so that the potentials of the bit lines $B_0$, $B_1$, --- $B_n$ are changed and the sense circuit 264 may malfunction.

The MOS-drive bipolar-output logic circuit described in the above embodiments requires a combination of a miniturized MOS transistor of less than 2 μm and a comparably miniturized bipolar transistor in order to drive the heavy load at the high speed. Thus, the above object is not attained by a low performance bipolar transistor such as a lateral NPN transistor by a CMOS process or a well structure vertical NPN transistor.

Figure 34:
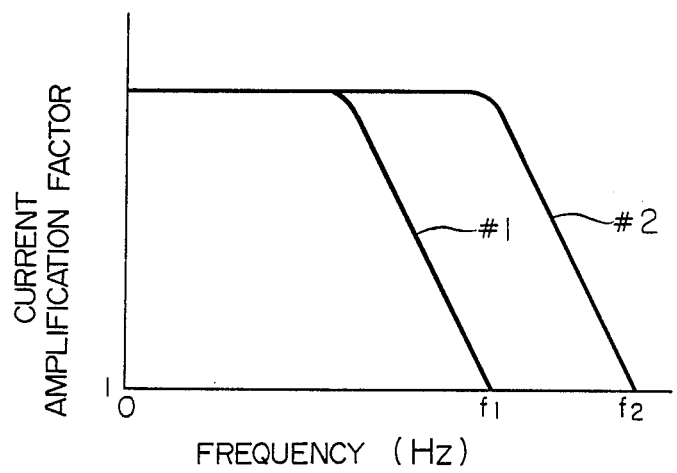
FIG. 34 shows a chart useful to explain the present invention.

The MOS-drive bipolar-output logic circuit amplifies the drive current of the MOS by the current gain of the bipolar transistor to charge or discharge a large current to or from a heavy load. As shown in FIG. 34, a current gain of a low performance bipolar transistor #1 is 1 at a frequency $f_1$ and it does no longer function as an amplifier. Thus, the high speed charge/discharge of the load by the bipolar transistor is not attained.

Figure 35:
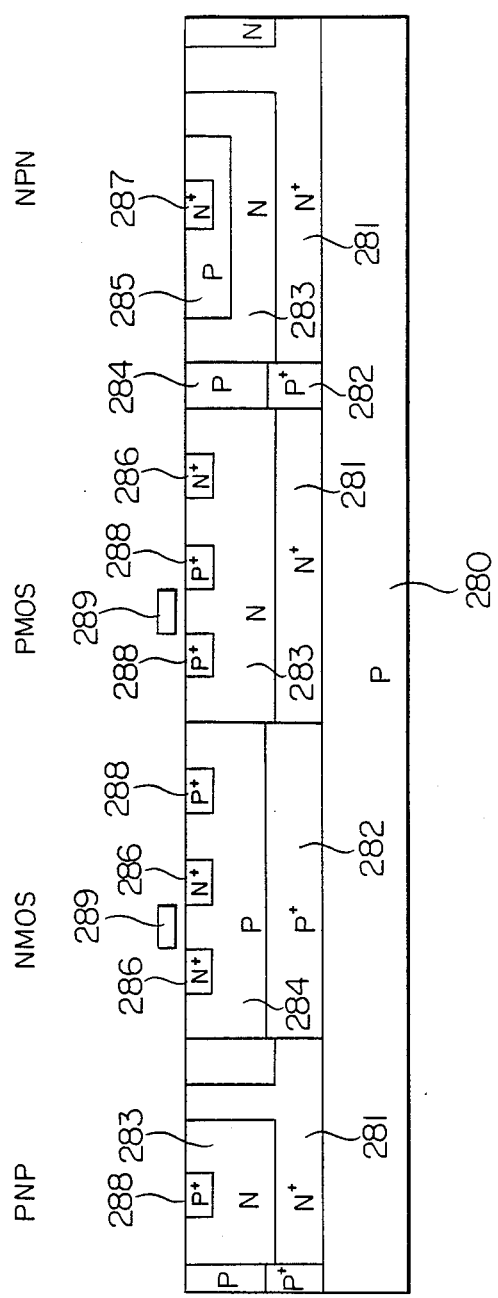
FIG. 35 shows a sectional view of a device structure of a composite circuit of the present invention.

FIG. 35 shows a sectional view of a device used in the MOS-drive bipolar-output logic circuit of the present invention. Numeral 280 denotes a p-substrate on which an n+- buried layer 281 and a p+-buried layer 282 is formed, and an n-epitaxial layer 283 and a p-epitaxial layer 284 are formed thereon. A PNP transistor is formed having the p-substrate 280 as a collector, the n-epitaxial layer 283 as a base and a p+- diffusion layer 288 as an emitter. An NMOS transistor is formed having the p-epitaxial layer 284 as a substrate, an n+- diffusion layer as a drain and a source, and a polysilicon 289 as a gate. A PMOS transistor is formed having the n-epitaxial layer 283 as a substrate, the p+- diffusion layer 288 as a drain and a source, and the polysilicon 289 as a gate. An NPN transistor is a collector-isolated vertical NPN transistor having the n-epitaxial layer 283 as a collector, a p-base diffusion layer 285 as a base and an n+- emitter diffusion layer 287 as an emitter. This device structure allows formation of a high performance bipolar transistor having an emitter width of less than 2 μm and the $f_T$ of higher than several giga $H_Z$.

We claim:

1. A semiconductor device comprising:
at least one MOS transistor;
at least one bipolar transistor adapted to be driven by said MOS transistor;
an output terminal connected to a collector or an emitter of said bipolar transistor;
logical inverter means for inverting a signal at said output terminal; and
a MOS transistor having a source and a drain thereof parallelly connected across the collector and the emitter of said bipolar transistor, adapted to be turned on and off by an output signal of said logical inverter means,
wherein said bipolar transistor is a vertical NPN transistor formed in an island on a semiconductor substrate isolated from said MOS transistors and has collector thereof isolated from said semiconductor substrate.

2. A semiconductor device comprising:
first terminal means for receiving a power supply voltage;
second terminal means for receiving a common potential;
output terminal means for outputting an output signal from said semiconductor device;
input terminal means for receiving at least one first input signal;
first means for outputting at least one first signal in response to said fist input signal, said first means including a MOS transistor;
first switching means including bipolar transistors adapted to be switched between said first terminal means and said second terminal means in response to said first signal to establish a first electrical connection between said first terminal means and the output terminal means or between said second terminal means and the output terminal means;
inverter means connected to said output terminal means for inverting the level of said output signal to produce an inverted signal; and
second switching means including a MOS transistor and connected in parallel to said first switching means for establishing a second electrical connection to prevent a voltage drop from being generated across said first electrical connection in response to said inverted signal,
wherein said first switching means includes a first NPN transistor having a collector thereof connected to said first terminal means and an emitter thereof connected to said output terminal means, and a second NPN transistor having a collector thereof connected to said output terminal means and an emitter thereof connected to said second terminal means, said first means includes at least one logical control circuit having at least one PMOS transistor and at least one NMOS transistor for producing second signals as said at least one first signal, said first and second NPN transistors being complementary driven by said second signals,
wherein said first means receives a second input signal and a third input signal of opposite polarity to said second input signal, in addition to said at least one first input signal, said logical control circuit includes a PMOS logical control circuit connected to the base of said first NPN transistor for driving said first NPN transistor in response to said first input signal, a PMOS switching circuit connected to the base of said first NPN transistor in series with said MOS logical control circuit and adapted to be turned on and off by said second input signal, and NMOS logical control circuit connected to the base of said second NPN transistor for driving said second NPN transistor in response to said first input signal, and an NMOS switching circuit connected to the base of said second NPN transistor in series with said NMOS logical control circuit and adapted to be turned on and off by said third input signal, said first and second NPN transistors being parallelly turned on and off in response to said second and third input signals.

3. A semiconductor device comprising:
first terminal means for receiving a power supply voltage;
second terminal means for receiving a common potential;
output terminal means for outputting an output signal from said semiconductor device;
input terminal means for receiving at least one first input signal;
first means for outputting at least one first signal in response to said first input signal, said first means including a MOS transistor;
first switching means including bipolar transistors adapted to be switched between said first terminal means and said second terminal means in response to said first signal to establish a first electrical connection between said first terminal means and the output terminal means or between said second terminal means and the output terminal means;
inverter means connected to said output terminal means for inverting the level of said output signal to produce and inverted signal; and
second switching means including a MOS transistor and Connected in parallel to said first switching means for establishing a second electrical connection to prevent a voltage drop from being generated across said first electrical connection in response to said inverted signal,
wherein said bipolar transistor is a vertical NPN transistor formed in a island on a semiconductor substrate isolated from the MOS transistors of said first means and said second switching means and has collectors thereof isolated from said semiconductor substrate.

4. A semiconductor device comprising:
first terminal means for receiving a power supply voltage;
second terminal means for receiving a common potential;
output terminal means for outputting an output signal from said semiconductor device;
input terminal means for receiving at least one first input signal;
first means for outputting at least one first signal in response to said first input signal, said first means including a MOS transistor;
first switching means including bipolar transistors adapted to be switched between said first terminal means and said second terminal means in response to said first signal to establish a first electrical connection between said first terminal means and the output terminal means or between said second terminal means and the output terminal means;
inverter means connected to said output terminal means for inverting the level of said output signal to produce an inverted signal; and
second switching means including a MOS transistor and connected in parallel to said first switching means for establishing a second electrical connection to prevent a voltage drop from being generated across said first electrical connection in response to said inverted signal,
wherein said semiconductor device is adapted to supply a common control signal of a tri-state output buffer circuit for controlling the outputting of a plurality of input signals to corresponding output pads by the common control signal.

5. A semiconductor device comprising:
first terminal means for receiving a power supply voltage;
second terminal means for receiving a common potential;
output terminal means for outputting an output signal from said semiconductor device;
input terminal means for receiving at least one first input signal;
first means for outputting at least one first signal in response to said first input signal, said first means including a MOS transistor;
first switching means including bipolar transistors adapted to be switched between said first terminal means and said second terminal means in response to said first signal to establish a first electrical connection between said first terminal means and the output terminal means or between said second terminal means and the output terminal means;
inverter means connected to said output terminal means for inverting the level of said output signal to produce an inverted signal; and
second switching means including a MOS transistor and connected in parallel to said first switching means for establishing a second electrical connection to prevent a voltage drop from being generated across said first electrical connection in response to said inverted signal,
wherein said semiconductor device is adapted to supply a gate drive signal having no level shift in at least a low level signal thereof as a drive signal for gates of NMOS switching circuits having said gates thereof connected in common.

6. A semiconductor device comprising:
first terminal means for receiving a power supply voltage;
second terminal means for receiving a common potential;
output terminal means for outputting an output signal from said semiconductor device;
input terminal means for receiving at least one first input signal;
first means for outputting at least one first signal in response to said first input signal, said first means including a MOS transistor;
first switching means including bipolar transistors adapted to be switched between said first terminal means and said second terminal means in response to said first signal to establish a first electrical connection between said first terminal means and the output terminal means or between said second terminal means and the output terminal means;
inverter means connected to said output terminal means for inverting the level of said output signal to produce an inverted signal; and
second switching means including a MOS transistor and connected in parallel to said first switching means for establishing a second electrical connection to prevent a voltage drop from being generated across said first electrical connection in response to said inverted signal, wherein said semiconductor device is adapted to supply a gate drive signal having no level shift in at least a high level signal thereof as a drive signal for gates of PMOS switching circuits having said gates thereof connected in common.

7. A semiconductor device comprising:

first terminal means for receiving a power supply voltage;

second terminal means for receiving a common potential;

output terminal means for outputting an output signal from said semiconductor device;

input terminal means of receiving at least one first input signal;

first means for outputting at least one first signal in response to said first input signal, said first means including a MOS transistor;

first switching means including bipolar transistors adapted to be switched between said first terminal means and said second terminal means in response to said first signal to establish a first electrical connection between said first terminal means and the output terminal means or between said second terminal means and the output terminal means;

inverter means connected to said output terminal means for inverting the level of said output signal to produce an inverted signal; and second switching means including a MOS transistor and connected in parallel to said first switching means for establishing a second electrical connection to prevent a voltage drop from being generated across said first electrical connection in response to said inverted signal, wherein said semiconductor device is adapted to supply a gate drive signal from a MOS switching circuit including pair of PMOS and NMOS transistors having gates thereof connected in common.

8. A semiconductor device comprising:

first terminal means of receiving a power supply voltage;

second terminal means for receiving a common potential;

output terminal means for outputting an output signal from said semiconductor device;

input terminal means for receiving at least one first input signal;

first means for outputting at least one first signal in response to said first input signal, said first means including a MOS transistor;

first switching means including bipolar transistors adapted to be switched between said first terminal means and said second terminal means in response to said first signal to establish a first electrical connection between said first terminal means and the output terminal means or between said second terminal means and the output terminal means;

inverter means connected to said output terminal means for inverting the level of said output signal to produce an inverted signal; and second switching means including a MOS transistor and connected in parallel to said first switching means for establishing a second electrical connection to prevent a voltage drop from being generated across said first electrical connection in response to said inverted signal, wherein said semiconductor device is adapted to supply first and second clock signals for an m-bit n-stage (m and n being no smaller than 1) dynamic shift register including a clocked inverter for controlling transmission of an input signal to an output by a first clock and a second clock of the opposite polarity to said first clock.

9. A semiconductor device comprising:

first terminal means for receiving a power supply voltage;

second terminal means for receiving a common potential;

output terminal means for outputting an output signal from said semiconductor device;

input terminal means for receiving at least one first input signal;

first means for outputting at least one first signal in response to said first input signal, said first means including a MOS transistor;

first switching means including bipolar transistors adapted to be switched between said first terminal means and said second terminal means in response to said first signal to establish a first electrical connection between said first terminal means and the output terminal means or between said second terminal means and the output terminal means;

inverter means connected to said output terminal means for inverting the level of said output signal to produce an inverted signal; and second switching means including a MOS transistor and connected in parallel to said first switching means for establishing a second electrical connection to prevent a voltage drop from being generated across said first electrical connection in response to said inverted signal, wherein said semiconductor device is adapted to supply first and second clock signals for an m-bit n-stage (m and n being no smaller than 1) dynamic shift register including a parallelly connected switch of a PMOS and an NMOS transistor for controlling transmission of an input signal to an output by a first clock and a second clock of the opposite polarity to said first clock.

10. A semiconductor device comprising:

first terminal means for receiving a power supply voltage;

second terminal means for receiving a common potential;

output terminal means for outputting an output signal from said semiconductor device;

input terminal means for receiving at least one first input signal;

first means for outputting at least one first signal in response to said first input signal, said first means including a MOS transistor;

first switching means including bipolar transistors adapted to be switched between said first terminal means and said second terminal means in response to said first signal to establish a first electrical connection between said first terminal means and the output terminal means or between said second terminal means and the output terminal means;

inverter means connected to said output terminal means for inverting the level of said output signal to produce an inverted signal; and second switching means including a MOS transistor and connected in parallel to said first switching means for establishing a second electrical connection to prevent a voltage drop from being generated across said first electrical connection in response to said inverted signal, wherein said semiconductor device is adapted to supply a signal having no level shift in at least a low level output thereof for driving one or both of a read control NMOS transistor and a write control NMOS transistor of an m-bit n-word (m and n being no smaller than 1) register file including a positive feedback static information memory having two inverters, said NMOS transistor for controlling reading of the memory and said NMOS transistor for controlling writing of said memory.

11. A semiconductor device comprising:

first terminal means for receiving a power supply voltage;

second terminal means for receiving a common potential;

output terminal means for outputting an output signal from said semiconductor device;

input terminal means for receiving at least one first input signal;

first means for outputting at least one first signal in response to said first input signal, said first means including a MOS transistor;

first switching means including bipolar transistors adapted to be switched between said first terminal means and said second terminal means in response to said first signal to establish a first electrical connection between said first terminal means and the output terminal means or between said second terminal means and the output terminal means;

inverter means connected to said output terminal means for inverting the level of said output signal to produce an inverted signal; and second switching means including a MOS transistor and connected in parallel to said first switching means for establishing a second electrical connection to prevent a voltage drop from being generated across said first electrical connection in response to said inverted signal, wherein said semiconductor device is adapted to supply a signal having no level shift in at least a low level output thereof as a word line signal for multi-bit static RAM including a positive feedback type static information memory having two inverters, and two NMOS transistors adapted to be turned on and off by the word line signal for controlling reading and writing of the information from and to said memory.

12. A semiconductor device comprising:

first terminal means for receiving a power supply voltage;

second terminal means for receiving a common potential;

output terminal means for outputting an output signal from said semiconductor device;

input terminal means for receiving at least one first input signal;

first means for outputting at least one first signal in response to said first input signal, said first means including a MOS transistor;

first switching means including bipolar transistors adapted to be switched between said first terminal means and said second terminal means in response to said first signal to establish a first electrical connection between said first terminal means and the output terminal means or between said second terminal means and the output terminal means;

inverter means connected to said output terminal means for inverting the level of said output signal to produce an inverted signal; and second switching means including a MOS transistor and connected in parallel to said first switching means for establishing a second electrical connection to prevent a voltage drop from being generated across said first electrical connection in response to said inverted signal, wherein said semiconductor device is adapted to supply a signal having no level shift in at least a low level output thereof as a word line signal for a multi-bit dynamic RAM including an NMOS transistor adapted to be turned on and off by the word line signal to control reading and writing of information and a capacitor for storing the information.

13. A semiconductor device comprising:

first terminal means for receiving a power supply voltage;

second terminal means for receiving a common potential;

output terminal means for outputting an output signal from said semiconductor device;

input terminal means for receiving at least one first input signal;

first means for outputting at least one first signal in response to said first input signal, said first means including a MOS transistor;

first switching means including bipolar transistors adapted to be switched between said first terminal means and said second terminal means in response to said first signal to establish a first electrical connection between said first terminal means and the output terminal means or between said second terminal means and the output terminal means;

inverter means connected to said output terminal means for inverting the level of said output signal to produce an inverted signal; and second switching means including a MOS transistor and connected in parallel to said first switching means for establishing a second electrical connection to prevent a voltage drop from being generated across said first electrical connection in response to said inverted signal, wherein said semiconductor device is adapted to supply a signal having no level shift in at least a low level output thereof as a word line signal for a multi-bit ROM including an NMOS transistor adapted to be turned on and off by said word line signal and a one-bit memory for storing "1" or "0" depending on whether said NMOS transistors is actively coupled to a digit line when the information is read.

14. A semiconductor device according to claim 2 wherein said semiconductor device is arranged to drive a common bus together with a MOS-drive bipolar-output tri-state logic circuit having a level shift in at least one output signal thereof.

15. A semiconductor device according to claim 7 wherein said PMOS and NMOS transistors are enhancement type transistors.

16. A semiconductor device according to claim 9 wherein said PMOS and NMOS transistors are enhancement type transistors.

17. A semiconductor device according to claim 10 wherein said read control NMOS and said write control NMOS transistors are enhancement type transistors.

18. A semiconductor device according to claim 11 wherein said NMOS transistors are enhancement type transistors.

19. A semiconductor device according to claim 16 wherein said NMOS transistor is an enhancement type transistor.

20. A semiconductor device according to claim 13 wherein said NMOS transistor is an enhancement type transistor.

* * * * *